United States Patent
Rossi et al.

(10) Patent No.: US 9,253,920 B2
(45) Date of Patent: Feb. 2, 2016

(54) COOLING DEVICE WITH LIQUID FOR ELECTRONIC CARDS, IN PARTICULAR FOR HIGH PERFORMANCE PROCESSING UNITS

(75) Inventors: Mauro Rossi, Gemona del Friuli (IT); Giampietro Tecchiolli, Trento (IT); Pierfrancesco Zuccato, Udine (IT)

(73) Assignee: EUROTECH SPA, Amaro (IT)

( * ) Notice: Subject to any disclaimer, the term of this patent is extended or adjusted under 35 U.S.C. 154(b) by 284 days.

(21) Appl. No.: 13/813,192

(22) PCT Filed: Jul. 29, 2011

(86) PCT No.: PCT/IB2011/001755
§ 371 (c)(1),
(2), (4) Date: Feb. 11, 2013

(87) PCT Pub. No.: WO2012/014058
PCT Pub. Date: Feb. 2, 2012

(65) Prior Publication Data
US 2013/0128460 A1    May 23, 2013

(30) Foreign Application Priority Data
Jul. 30, 2010  (IT) .............................. UD2010A0157

(51) Int. Cl.
*H05K 7/20*    (2006.01)

(52) U.S. Cl.
CPC ........ *H05K 7/20254* (2013.01); *H05K 7/20636* (2013.01); *H05K 7/20772* (2013.01)

(58) Field of Classification Search
CPC ....... G06F 1/16; G06F 1/20; G06F 2200/201; H01L 2924/00; H01L 2924/0002; H01L 23/40; H01L 23/42; H01L 23/473; H01L 23/3121; H01L 23/367; F28F 1/40; F28F 13/08; F28F 3/12; F28F 2255/16
USPC .......................................... 361/699, 702, 720
See application file for complete search history.

(56) References Cited

U.S. PATENT DOCUMENTS

| | | | |
|---|---|---|---|
| 4,268,850 A | | 5/1981 | Lazarek et al. |
| 4,283,754 A | * | 8/1981 | Parks ........................... 361/703 |

(Continued)

FOREIGN PATENT DOCUMENTS

| | | |
|---|---|---|
| EP | 1605741 | 12/2005 |
| EP | 1863156 | 12/2007 |

(Continued)

OTHER PUBLICATIONS

International Search Report filed in PCT/IB2011/001755.

(Continued)

*Primary Examiner* — Anthony Haughton
*Assistant Examiner* — Matt Dhillon
(74) *Attorney, Agent, or Firm* — Rankin, Hill & Clark LLP

(57) ABSTRACT

Cooling device with liquid for electronic cards, in particular for high-performance processing units, comprising at least a hydraulic circuit in which a heat-carrying fluid flows in order to extract the heat produced by electronic components and/or hot spots present on an associated electronic card. The device comprises a cooling plate mechanically coupled to the electronic card so as to be inserted in a containing rack of the processing unit. The plate has a heat extraction surface facing and partly in contact, or at least in close proximity, with the electronic components and/or the hot spots. The hydraulic circuit is made in the thickness of the plate and has a geometric grid development, along which a plurality of hydraulic sub-circuits are disposed and switching means to define desired paths. The plate has sliding guide means able to cooperate with corresponding alignment means of the containing rack.

11 Claims, 8 Drawing Sheets

(56) References Cited

U.S. PATENT DOCUMENTS

| | | | |
|---|---|---|---|
| 5,177,666 A * | 1/1993 | Bland et al. | 361/689 |
| 5,414,592 A * | 5/1995 | Stout et al. | 361/704 |
| 6,406,839 B1 * | 6/2002 | Segall et al. | 435/1.2 |
| 6,942,018 B2 * | 9/2005 | Goodson et al. | 165/80.4 |
| 7,312,987 B1 * | 12/2007 | Konshak | 361/679.48 |
| 7,961,465 B2 * | 6/2011 | Goldrian et al. | 361/699 |
| 7,978,472 B2 * | 7/2011 | Campbell et al. | 361/699 |
| 2004/0057211 A1 | 3/2004 | Kondo et al. | |
| 2008/0296256 A1 | 12/2008 | Panek | |

FOREIGN PATENT DOCUMENTS

| | | |
|---|---|---|
| JP | S58-180692 | 12/1983 |
| JP | 02-166755 | 6/1990 |
| JP | 2001177017 | 6/2001 |
| JP | 2004246615 | 9/2004 |
| JP | 2005191474 | 7/2005 |
| JP | 2006165186 | 6/2006 |
| WO | 2006103721 | 10/2006 |
| WO | 2010130993 | 11/2010 |

OTHER PUBLICATIONS

Office action filed in JP 2013-521241 dated Mar. 3, 2015 (English translation included).

* cited by examiner

COOLING DEVICE WITH LIQUID FOR ELECTRONIC CARDS, IN PARTICULAR FOR HIGH PERFORMANCE PROCESSING UNITS

FIELD OF THE INVENTION

The present invention concerns a cooling device with liquid for electronic cards, in particular for high-performance processing units.

BACKGROUND OF THE INVENTION

In the field of high-performance processing units or "supercomputers" it is known to cool the electronic cards, and in particular the electronic components mounted on them, such as integrated circuits, microprocessors and others, in order to prevent the limit values of functioning temperature from being exceeded, above which irreversible damage can be caused. Moreover, by restricting the functioning temperature range of the electronic cards by cooling them, it is possible to increase the working life of their components, at the same time reducing possible maintenance interventions.

Air cooling, that is, using a stream of forced air which is conveyed above the electronic components that produce most heat, and which is subsequently extracted from inside the container or rack of the electronic cards by means of one or more fans, does not allow an efficient removal of the heat produced, especially when there is a high density of electronic integration of the components on the cards.

Moreover, the presence of continuously moving mechanical components, such as the fans, entails the need for periodic diagnostic controls and/or maintenance in order to verify their correct functioning or to remove possible residues of impurities, such as powders or other, which can compromise the proper functioning. Such systems are also noisy and, if there are a large number of fans, they can make the work environment uncomfortable.

One cooling technique typically used for high-performance processing units is the type using liquid. This technique provides that the heat of the air heated by the electronic components of the cards is given up, inside the container, to a heat-carrying fluid which is made to circulate in a pipe, which develops, at least partly, inside the container itself. The pipe is designed, in general, to pass near the main electronic components, or near the possible auxiliary dissipaters directly mounted on the electronic components, and near the main hot points of heat production, also known as "hot spots", of the electronic cards; it then exits from the container, or rack, in order to give up the heat thus taken in. The pipe can carry on directly toward a heat exchange device, disposed for example outside the premises where the processing unit is disposed, or it can be thermally coupled to an auxiliary pipe, hydraulically separated from it, which is in turn connected to the heat exchange device.

One drawback of this cooling technique with liquid is that, in the case of high integration of the electronic components and of high density of the hot spots, the spaces for the movement of the hot air inside the container or rack can be reduced quite considerably, and may even obstruct the desired movement of hot air toward the points provided for heat exchange on the pipe, rendering the extraction of heat inefficient and increasing the electric consumption of the processing units.

In order to at least partially improve the cooling performance and to resolve the aforesaid problems, the pipe can be designed so as to directly contact the main electronic components and the hot spots of the electronic cards.

However, one drawback of this solution is the constraints and the mechanical interferences due to the conformation and development of the pipe inside the container or rack, in which the electronic cards are housed. This, in its turn, makes it very difficult to remove the electronic cards from the container or rack, in practice increasing the times and the maintenance costs.

Moreover, cooling plates are known, for example from the patent application US2008/0296256 and from the patent JP2166755, which can be associated with the electronic cards and provided with a corresponding internal hydraulic circuit in which a heat-carrying fluid is made to flow. The cooling plates have a transverse thickness, which together with the thickness of the electronic cards themselves, makes it difficult to insert them inside the containing racks of the processing units. Moreover, the extraction of the heat is not very efficient, given that the heat-carrying fluid is hotter toward the exit from the hydraulic circuit, thus determining an inefficient cooling of some electronic components or of the relative hot spots, or requiring an over-sizing of the hydraulic circuits themselves.

Another known solution is described in U.S. Pat. No. 5,177,666, which provides to use a support element for each electronic card with a printed circuit (PCB), which acts both as mechanical support for the card and also feeds the system. This solution, because it requires a separate support element, is not very efficient, it is bulky, it cannot have any shape whatsoever, it is not adaptable to any PCB configuration, it requires a precise assemblage sequence, there are maintenance problems and still other drawbacks.

One purpose of the present invention is to obtain a cooling device with liquid for electronic cards, in particular for high-performance processing units, which allows to reduce the times and costs of maintenance and facilitates the extraction and/or insertion of the electronic cards from a relative container or rack.

A further purpose of the present invention is to obtain a cooling device with liquid for electronic cards, in particular for high-performance processing units, which allows an efficient heat removal even in the case of electronic cards with a high integration density.

A further purpose of the present invention is to obtain a cooling device with liquid for electronic cards, in particular for high-performance processing units, which allows to reduce electric consumption and to increase the working life of the processing units.

Another purpose of the present invention is to obtain a cooling device with liquid for electronic cards, in particular for high-performance processing units, which allows to minimize the bulk and overall weight of the electronic card and of the device itself, and therefore of the entire processing unit.

The Applicant has devised, tested and embodied the present invention to overcome the shortcomings of the state of the art and to obtain these and other purposes and advantages.

SUMMARY OF THE INVENTION

The present invention is set forth and characterized in the independent claim, while the dependent claims describe other characteristics of the invention or variants to the main inventive idea.

In accordance with the above purposes, a cooling device with liquid for electronic cards, in particular for high-performance processing units, such as supercomputers, or others, according to the present invention is of the type having at least one hydraulic circuit in which a heat-carrying fluid or cooling fluid flows, to extract the heat produced by the electronic components and/or by the hot spots present on at least an associated electronic card. The hydraulic circuit is specifically designed to have a development coordinated to the disposition of the main electronic components and/or the hot spots on the electronic card.

According to one feature of the invention, the cooling device with liquid comprises at least a cooling plate made of heat conductive material, which is mechanically coupled, during use, to an electronic card so as to be inserted in a containing rack for electronic cards of the processing unit. The cooling plate has at least one heat extraction surface facing toward the electric components and/or the hot spots of the associated electronic card and is configured so as to be at least partly in contact with, or at least in close proximity, in the order of tenths of a millimeter, to the electronic components and/or the hot spots of the associated electronic card. Inside the plate, in particular in its thickness, the hydraulic circuit is defined where the cooling fluid flows, according to a development mating with the heat distribution on the associated electronic card and therefore with the position of the electronic components and/or the hot spots of the associated electronic card.

In one solution of the invention the hydraulic circuit consists of a channel with a regular geometric grid made in the thickness of the plate. The channel has a plurality of hydraulic sub-circuits and switching/deflector means, associated with the hydraulic sub-circuits, in order to selectively condition, and in a variable manner, the development and flow rate of the heat-carrying fluid inside the cooling plate, depending on the actual heat generated by the electronic components and/or the hot spots.

The cooling plate has sliding guide means able to cooperate with corresponding alignment means of the containing rack for the electronic cards.

Thanks to the sliding guide means it is possible to prevent the mechanical interferences of the known state of the art between adjacent electronic cards, due to the bulk of the circuit itself. Moreover, it is not difficult to extract the electronic card for maintenance needs, together with the cooling plate, from a corresponding containing rack, as it is for cooling devices with liquid in the state of the art, and the extraction is substantially facilitated by the sliding guides. Moreover, as the guides are directly integrated in the plate, it is possible to reduce, to a considerable extent, the possible breakages of the electronic card, given that, during the extraction/insertion operations, the electronic card is not physically touched.

In one form of embodiment, the sliding guide means comprise grooves, or guides, which develop longitudinally on one or more lateral edges of the cooling plate.

According to a variant of the invention, the cooling plate has holed portions made in specific positions corresponding to predetermined zones of the associated electronic card in which there is no production of heat.

According to a further variant, the cooling plate has means to attach it to the electronic card which are positioned in a coordinated manner to corresponding clamping means of a backplate associated with a micro-processor mounted on the electronic card, wherein the backplate is mounted on an opposite face of the electronic card to that on which the microprocessor is mounted In one solution of the present invention, the switching/deflector means consist of plugs, or similar means, disposed along at least part of the branches of the hydraulic circuit made in the plate, and suitable to create areas of greater cooling thanks to the greater amount of liquid which passes through them.

Therefore the cooling device with liquid according to the present invention allows to selectively convey a desired amount of heat-carrying fluid depending on the effective circuital or topological configuration of the associated electronic card, toward specific electronic components. Moreover, given that the heat extraction surface is directly in contact with the electronic components and with the hot spots of the electronic card, it is possible to carry out a very efficient heat exchange. In turn this allows to maintain the temperature of the electronic components within optimal functioning ranges, typically the suggested operating ranges, allowing a substantial reduction in electric consumption, and increasing their working life.

According to a further variant of the present invention, the cooling plate is mechanically coupled to the electronic card by means of elastic attachment and traction means.

Therefore the cooling device according to the present invention also allows, as a further connected advantage, to increase the mechanical rigidity and stability of the electronic card and to absorb possible mechanical tensions and stresses. Indeed, electronic cards for high-performance processing units usually have considerable longitudinal sizes and are subjected, when they are inserted into the rack, to considerable mechanical stresses in a longitudinal direction in order to determine the mechanical coupling between the relative electric connectors in the rack. Moreover, given that the cooling plate is stably disposed, during use, above and directly in contact with the components to be cooled, it acts as a protection element, considerably reducing the possibility of breakage of the electronic components during normal maintenance operations.

According to a variant of the present invention, the heat extraction surface is conformed so as to have protruding dissipation portions, disposed in a manner coordinated to the position of the electronic components and/or the hot spots of the electronic card, so as to contact the electronic components and/or the hot spots.

According to another variant of the invention, at least part of the protruding portions is associated with a heat interface material in order to promote the transfer of heat from a corresponding hot electronic component toward the cooling plate.

According to a further variant of the invention, the heat extraction surface also comprises hollow portions disposed in a manner coordinated to the position of specific electronic components and with a depth coordinated to the height of the specific electronic components.

According to a further variant of the present invention, the cooling plate comprises rapid disconnection and dripless hydraulic connectors, which are associated with an entrance and an exit of the hydraulic circuit.

It comes within the field of the present invention to provide that the cooling plate has an auxiliary heat extraction surface, opposite the heat extraction surface, for association with a different electronic card. In this case, a different electronic card can be attached on to the auxiliary heat extraction surface, or alternatively the auxiliary heat extraction surface can be disposed, during use, in close proximity to the back part of an adjacent electronic card, which, in its turn, is supplied with an associated cooling plate.

It also comes within the field of the present invention to provide that the plate of the cooling device according to the invention comprises extraction handles, in order to facilitate the handling of the associated electronic card, for example to extract or insert it from/into the containing rack of the processing unit.

The present invention also concerns an electronic card, in particular for high-performance processing units, such as supercomputers, which is provided with a cooling device with liquid as previously described.

BRIEF DESCRIPTION OF THE DRAWINGS

These and other characteristics of the present invention will become apparent from the following description of a preferential form of embodiment, given as a non-restrictive example with reference to the attached drawings wherein.

Figure 1:
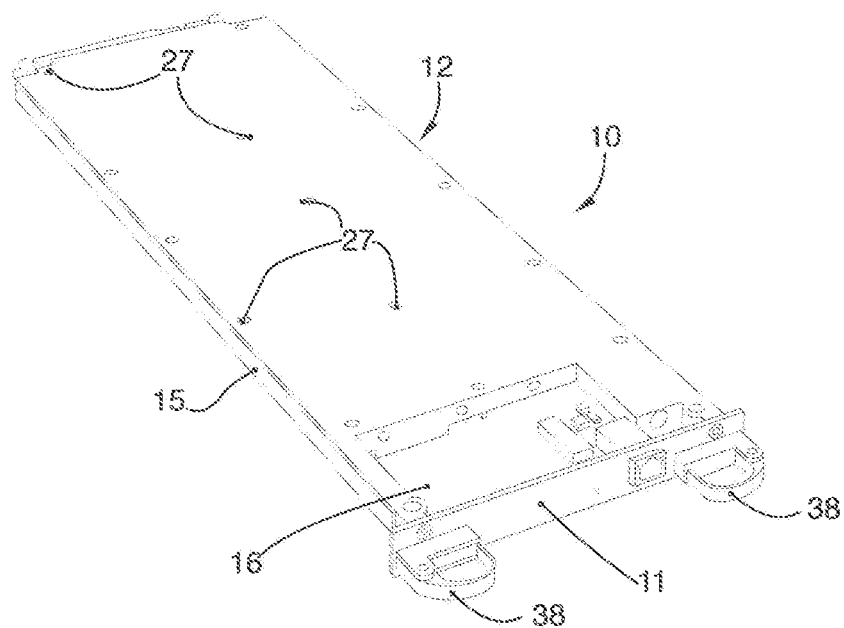
FIG. 1 is a perspective view of an electronic card on which a cooling device with liquid according to the present invention is mounted.

To facilitate comprehension, the same reference numbers have been used, where possible, to identify identical common elements in the drawings. It is understood that elements and characteristics of one form of embodiment can conveniently be incorporated into other forms of embodiment without further clarifications.

DETAILED DESCRIPTION OF A PREFERENTIAL FORM OF EMBODIMENT

With reference to the attached drawings, a cooling device 10 with liquid for electronic cards according to the present invention can be used, preferably but not exclusively, in high-performance processing units such as supercomputers. In particular the cooling device 10 with liquid according to the present invention allows to increase the mechanical stability of the electronic cards and to speed up maintenance operations, such as the extraction or substitution or hot swap of electronic cards, or compute nodes of said supercomputers. It is understood that the device 10 according to the present invention can also be used for cooling graphic processing cards, control cards or other cards also used in processing units such as the work station or others.

Figure 12:
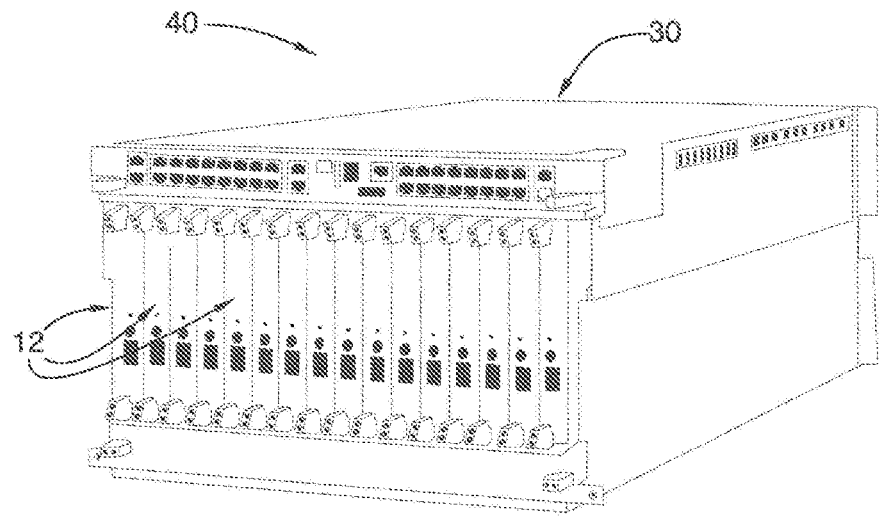
FIG. 12 is a front perspective view of the housing rack in FIG. 6 completely occupied by electronic cards and by the associated cooling devices with liquid.

As shown in the drawings, the device 10 is applied to electronic processing cards 16 of a high capacity processing unit 40 (FIG. 12) or supercomputer, which has one or more containing racks 30 into which the cards 16 are inserted modularly. The rack 30 has sliding guide means, or rails 31, which develop in depth in the rack 30 and are used to insert and extract the cards 16 and the associated device 10 from the rack 30.

Figure 5:
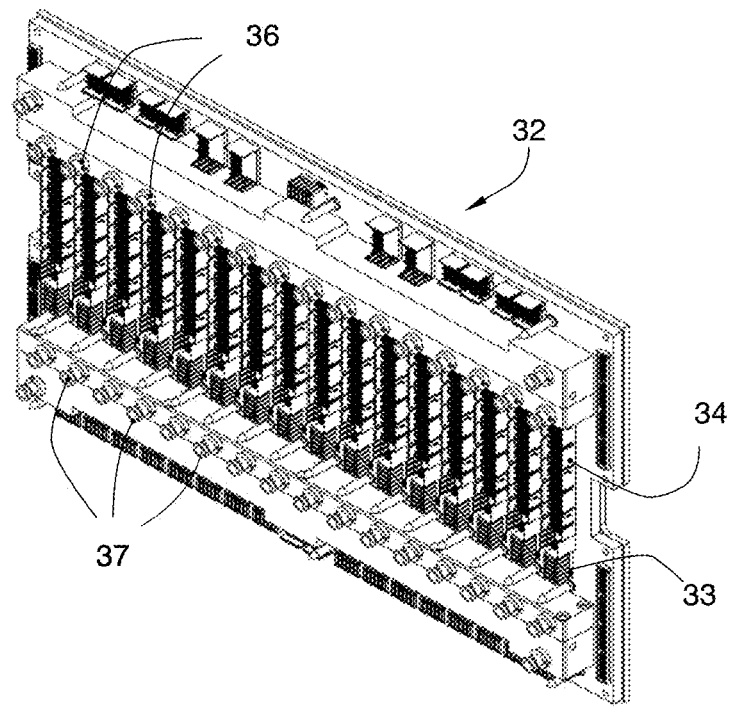
FIG. 5 is a perspective view of a back card or backplane, of a housing rack for electronic cards provided with the cooling device with liquid in FIG. 1.
Figure 13:
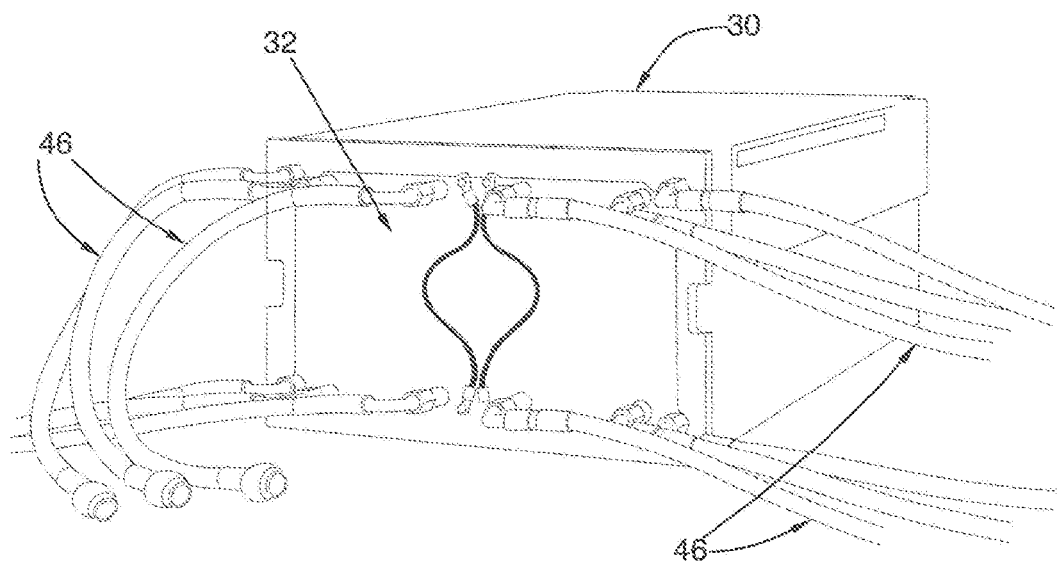
FIG. 13 is a rear perspective view of the rack in FIG. 12.

The processing unit 40 also has a back electronic plate 32, or backplane (FIGS. 5 and 13), which, as well as closing the rack 30 at the back, comprises electric connectors 33 to feed the card 16 and interface connectors 34 for communication between the cards 16. The connectors 33, 34 are disposed in a regular manner on a first face of the back plate 32 facing, in use, toward the inside of the rack 30, at a predetermined reciprocal distance. In particular the connectors 33, 34 are disposed in pairs, each pair of connectors 33, 34 being used to connect a relative card 16, so as to allow a reciprocally adjacent disposition of the cards 16 and of the associated cooling devices 10 in the containing rack 30.

The back plate 32 also comprises a plurality of male inlet hydraulic connectors 36, one for each electronic card 16, and a plurality of male outlet hydraulic connectors 37, one for each electronic card 16, which are coupled mechanically and hydraulically to corresponding female inlet and outlet connectors of the cooling device 10 as will be described better hereinafter.

Figure 3:
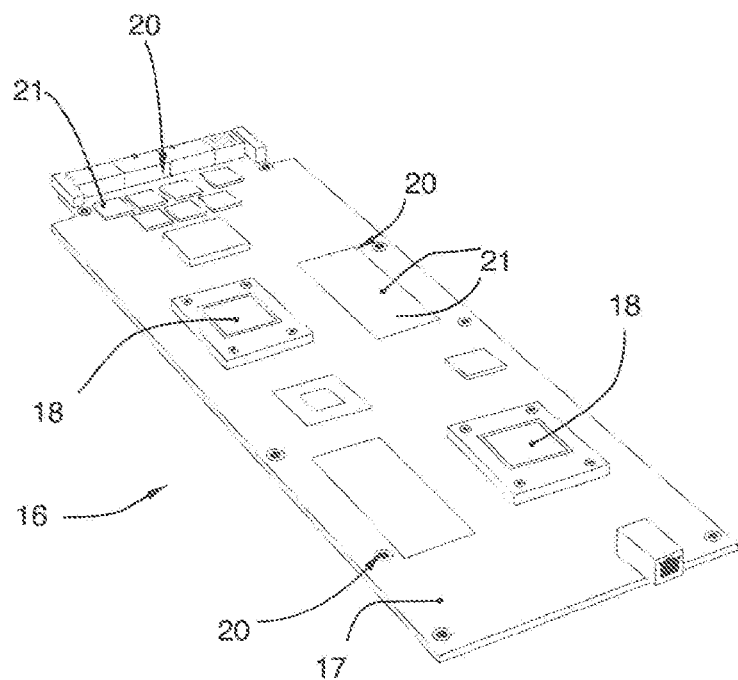
FIG. 3 is a perspective view of the electronic card separated from the cooling device with liquid according to the present invention.
Figure 4:
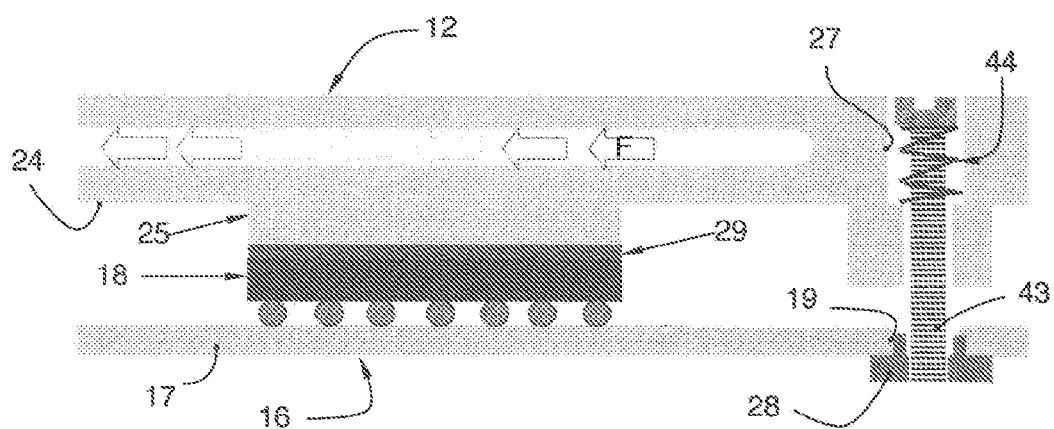
FIG. 4 is a schematic view of the assembly of the cooling device with liquid associated with the electronic card.

The electronic cards 16 achieve a desired processing functionality and comprise a PCB 17 (Printed Circuit Board) (FIG. 3), such as a multilayer PCB, on which electronic components are welded according to a predetermined topological and circuital plan.

In particular the electronic components can comprise microprocessors 18, passive components, such as resistances, capacities and inductances, not shown in the drawings, and integrated circuits 21, such as memory banks or other specific components. In particular the memory banks or other high frequency functioning components, define predetermined hot spots (identified with reference number 20 in FIG. 3) on the card 16, that is, specific zones on the PCB 17 in which a high amount of heat is produced.

The electronic cards 16 also have through holes 19 which are aligned, in use, with attachment holes 27 of a cooling plate 12 of the device 10 as will be described hereinafter.

The cooling plate 12, made of aluminum for example, or other suitable material with high heat conductivity, is designed to be shaped in a manner mating with the electronic card 16 and has a front portion 11, which is normally disposed, in use, toward the outside of the rack 30. The front portion 11 is provided with opposite handles 38 (FIG. 1) to facilitate the extraction and insertion of the electronic card 16 together with the plate 12 from/into the rack 30. In a different form of embodiment (FIGS. 7 and 8) the extraction handles 138 are of the type which can be associated with an extraction instrument, such as grippers of the known type. The handles 38, 138 can be made integrally to the plate 12 or can be mounted in a stable manner on it.

Figure 2:
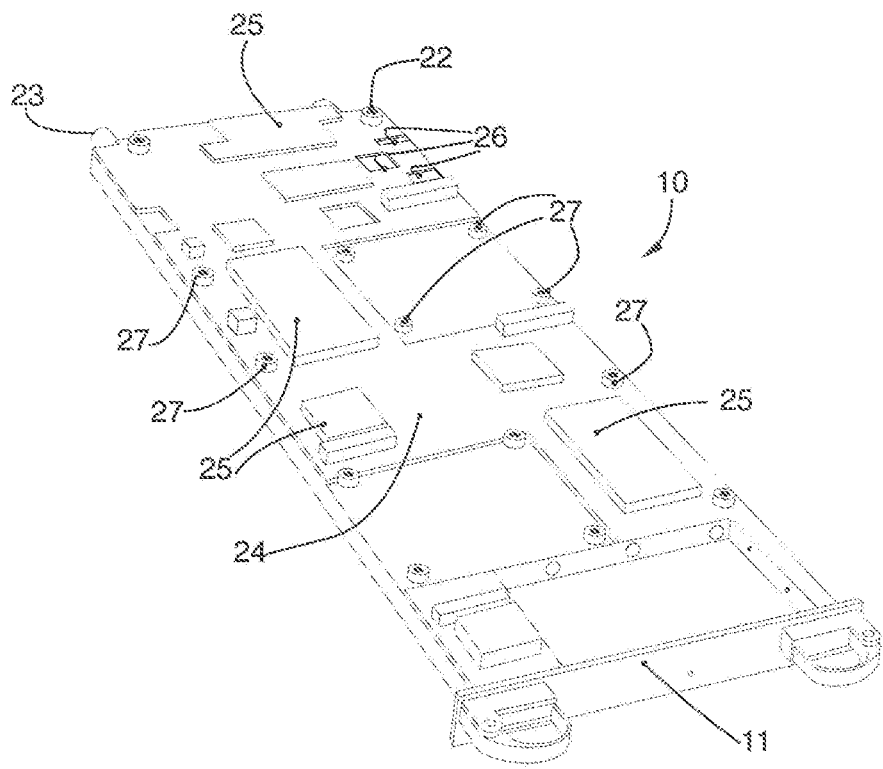
FIG. 2 is a perspective view of a heat extraction surface of the cooling device with liquid according to the present invention.

The plate 12 has a heat extraction surface 24 (FIG. 2) which is facing, in use, toward the PCB 17 on which the electronic components are mounted and where the hot spots 20, defined by the banks of the integrated circuits 21, are concentrated.

On its extraction surface 24, the plate 12 has dissipation protuberances 25 which are disposed in a coordinated manner to the position of the microprocessors 18 or of the hot spots 20 on the PCB 17, and have sizes and shape mating with those of the electronic components from which the heat is to be extracted during their functioning. The protuberances 25 have a transverse thickness such as to contact directly or indirectly, during use, an associated component or hot spot 20.

In one form of embodiment of the invention, the protuberances 25 are associated with a layer of heat interface material 29, of a known type, interposed between the protuberance 25 and a corresponding electronic component, for example a microprocessor 18, so as to increase the efficiency of the transfer of heat due to heat conduction toward the plate 12.

The plate 12 also has predetermined hollow portions 26 which are disposed in a manner coordinated with the position of specific electronic components having a greater bulk in height. Therefore, the cooling plate 12 is shaped so as to prevent possible mechanical interferences or to allow the assembly of specific components of different sizes.

Figure 7:
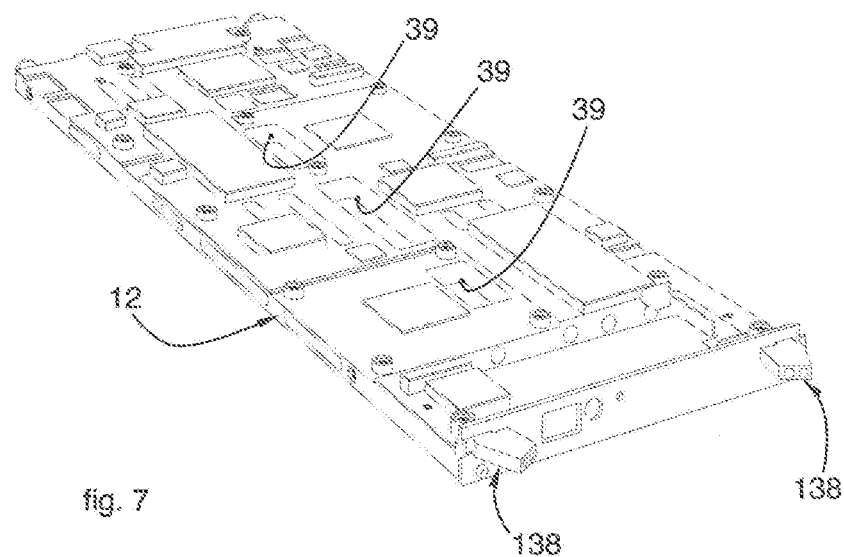
FIG. 7 is a perspective view of a variant of the cooling device according to the present invention.
Figure 8:
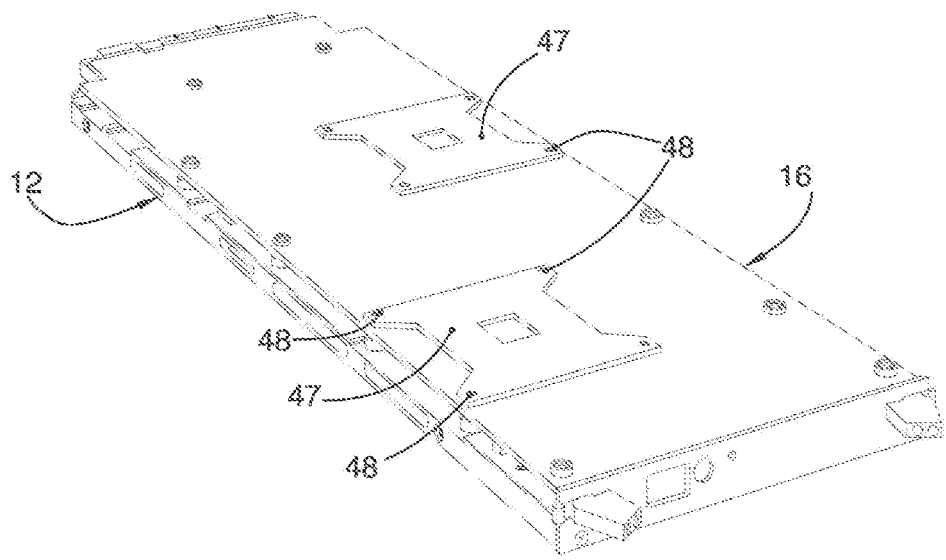
FIG. 8 is a "side-bottom" view of an electronic card provided with support elements which cooperate with the cooling device with liquid according to the present invention.
Figure 9:
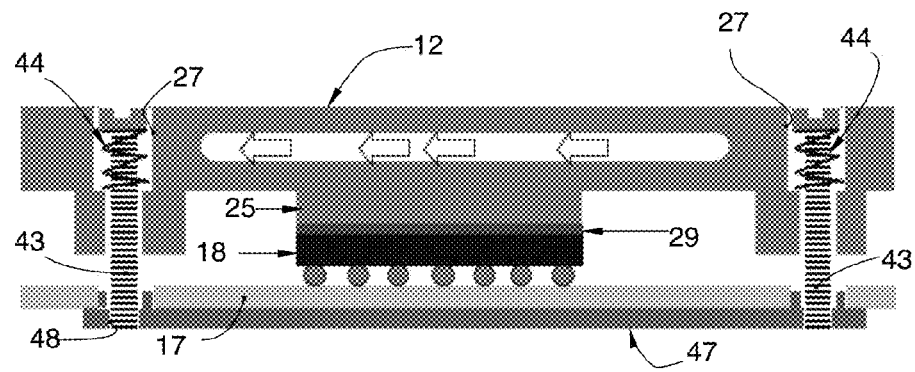
FIG. 9 is a schematic view of a detail of the assembly of the electronic card and the cooling device in FIG. 8.
Figure 10:
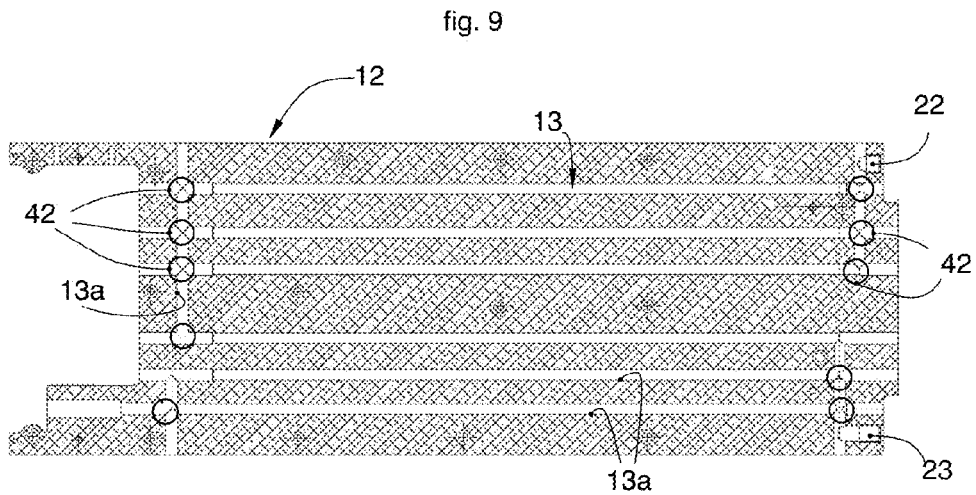
FIG. 10 is a schematic view in section which shows a hydraulic circuit of the cooling device with liquid according to the present invention.

In a form of embodiment shown in FIG. 7, the plate 12 also has through holed portions 39 between the heat extraction surface 24 and a surface opposite to it. The holed portions 39 are made in specific positions corresponding to predetermined zones of the associated electronic card 16 in which there is no heat production, for example where there are no microprocessors 18 or other electronic components. Therefore the plate 12 thus made has less weight compared to a substantially full plate. This solution allows to reduce the overall weight which has to be supported by the containing rack 30 and therefore, in turn, the overall weight in a possible cabinet consisting of several racks 30.

The plate 12 also comprises a hydraulic circuit 13 (FIGS. 4, 9, 10 and 11) in which a heat-carrying fluid is made to flow, which extracts the heat produced by the electronic components and transfers it outside the plate 12. The hydraulic circuit develops inside the plate 12, comprised in its transverse thickness, according to a predetermined development, substantially coordinated to the position of the electronic components and to the hot spots 21 of the associated electronic card 16.

The plate 12 also comprises a hydraulic circuit 13 (FIGS. 4, 9, 10 and 11) in which a heat-carrying fluid is made to flow, which extracts the heat produced by the electronic components and transfers it outside the plate 12. The hydraulic circuit develops inside the plate 12, comprised in its transverse thickness, according to a predetermined development, substantially coordinated to the position of the electronic components and to the hot spots 20 of the associated electronic card 16.

The female hydraulic connectors 22, 23 and the male hydraulic connectors 36, 37 are known connectors of the "quick disconnect zero spillage" type, which have a double closing valve, which at the moment of mechanical disconnection interrupts the respective hydraulic circuits, preventing the spillage of the heat-carrying fluid.

Figure 11:
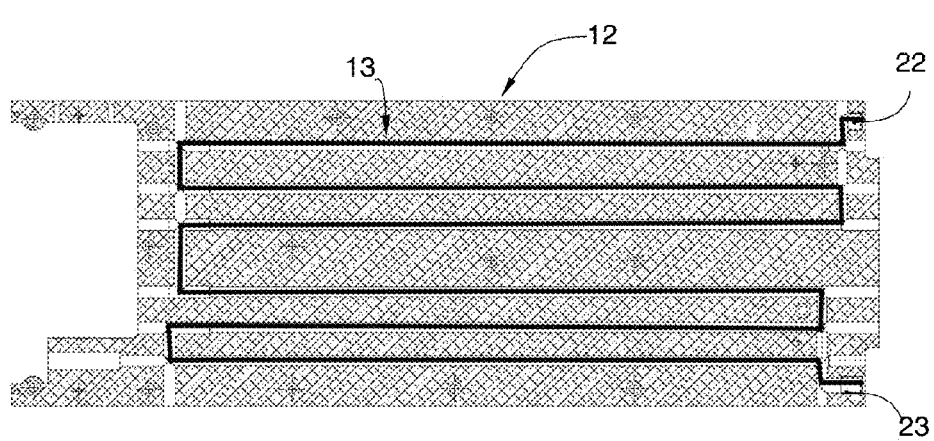
FIG. 11 is a schematic view in section showing the progress of the heat-carrying fluid in the hydraulic circuit in FIG. 10.

The hydraulic circuit 13 has a plurality of hydraulic sub-circuits 13a, in a grid structure, which are selectively activated by means of switching/deflector elements 42, so as to condition the progress and circulation of the heat-carrying fluid inside the cooling plate 12 according to a desired travel from the inlet hydraulic connector 22 to the outlet hydraulic connector 23. In this way, as shown in FIG. 11, it is possible to adapt the stream of the heat-carrying fluid in the plate 12 depending on the actual heat generation by the electronic components and/or the hot spots 20.

The attachment holes 27 are made in positions mating with the position of the through holes 19 of the PCB 17 so as to be reciprocally aligned and allow corresponding attachment screws 43 (FIG. 4) to be inserted into them, for the stable mechanical coupling of the plate 12 and the electronic card 16. In particular a terminal end of the screw 43 cooperates with a threaded coupling washer 28, or "penmet", inserted under pressure into the corresponding through hole 19.

Advantageously, the mechanical coupling provides to use elastic springs 44, disposed coaxial to the screws 43 in the attachment holes 27 of the plate 12, which allow to balance the traction action exerted by the screws 43.

In one form of embodiment, some of the attachment holes 27 of the plate 12 are made in predetermined positions so as to be aligned with corresponding clamping holes 48 of a backplate 47, mounted on the opposite face of the electronic card 16, in correspondence with a relative microprocessor 18. Therefore the plate 12 is attached to the electronic card 16 using screws 43 which are inserted in holes, both on the backplate 47 and on the PCB 17, which holes already exist for the assembly of the backplate 47 itself. Moreover, the backplate 47 and the plate 12 are reciprocally clamped also in correspondence with the microprocessor 18, cooperating mechanically in a reciprocal manner and exerting an action of compression on the heat interface layer 29 and on the microprocessor 18, determining a greater local stiffening on the PCB 17. This increases both the stability and the mechanical rigidity of the combined card 16 and plate 12 and improves the extraction of heat produced by the specific microprocessor 18 associated with the backplate 48.

The plate 12 also has sliding guide means 15 suitable to cooperate with the rails 31 of the containing rack 30 for the insertion/extraction of the electronic card 16 into/from the rack 30. The sliding guide means 15 are conformed in a substantially mating manner with the rails 31. The fact that the sliding guide means 15 are made directly on the plate 12 allows to avoid the direct contact of the edges of the PCB 17 with the rails 31 themselves, as occurs in the state of the art, reducing the possibility of breakages or damages during the operations of extracting or inserting the cards 16.

The sliding guide means 15 develop substantially along the lateral edge of the card 16 for the whole of its length. The sliding guide means 15 cooperate with corresponding sliding rails 31 which develop horizontally in the direction of the depth of the containing rack 30.

Figure 6:
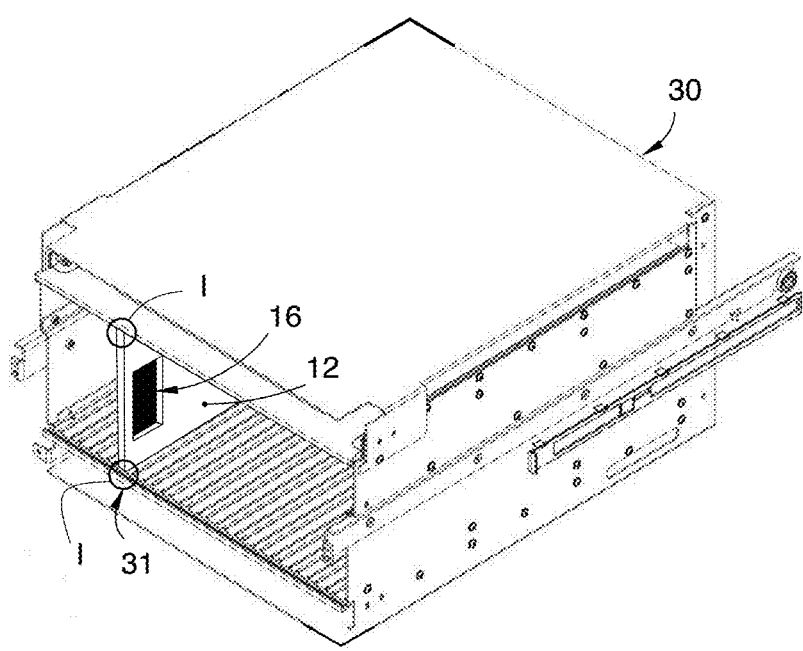
FIG. 6 is a perspective front view of a housing rack in which an electronic card associated with a relative cooling device is housed.
Figure 6A:
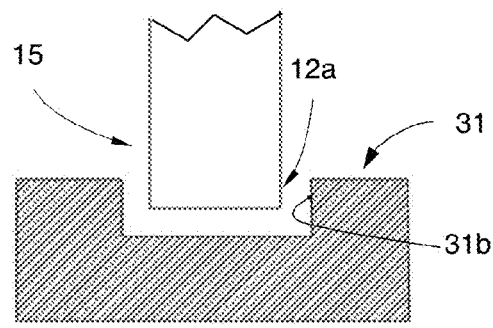
FIGS. 6A-6C are enlarged views of different examples of a detail in FIG. 6.
Figure 6B:
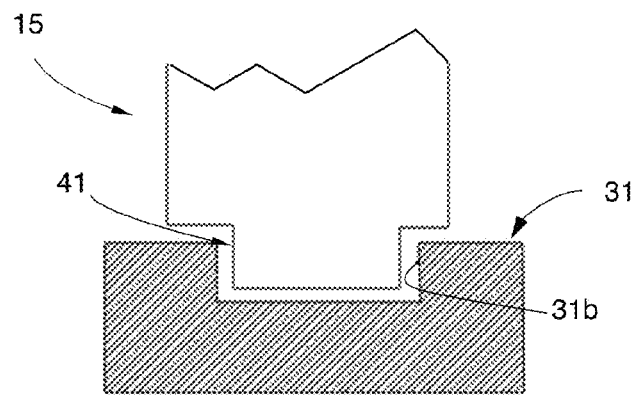
Figure 6C:
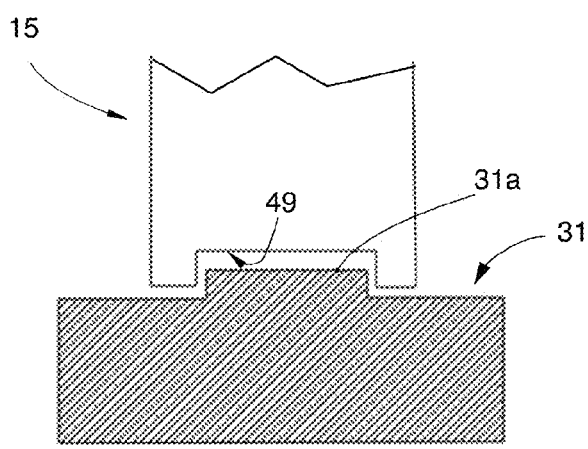

In FIGS. 6A-6C some examples of embodiment are shown: in a first form of embodiment (FIG. 6A) the sliding guide means 15 comprise all the lateral edge 12a of the plate 12, which cooperates with a groove 31a made on the rail 31; in a second form of embodiment the sliding guide means 15 comprise a protuberance 41, with a squared transverse profile, which develops longitudinally and cooperates with the groove 31b; in a different form of embodiment (FIG. 6C) the sliding guide means 15 comprise a groove 49, with a squared profile, which cooperates with a mating protruding portion 31a of the rail 31.

Figure 14:
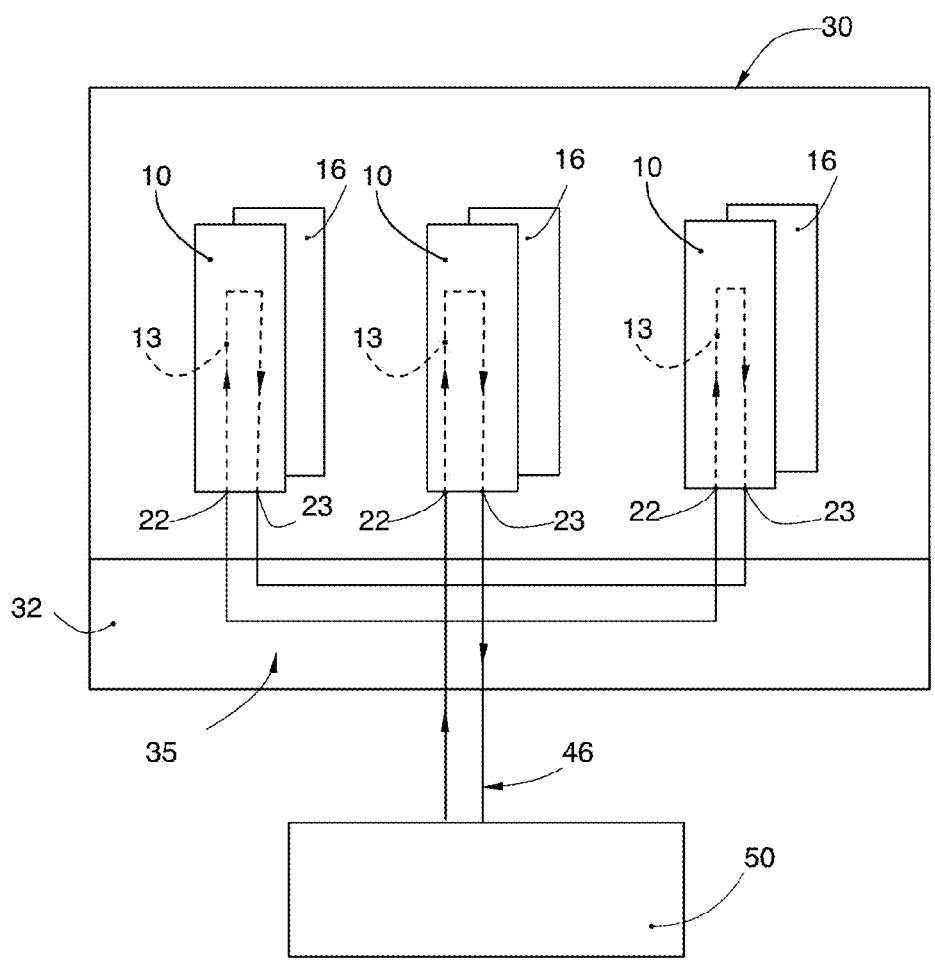
FIG. 14 is a schematic view of the housing rack in which there is a plurality of electronic cards and associated cooling devices with liquid according to the present invention.

The hydraulic circuits 13 of the devices 10 are connected at inlet and at outlet respectively with the hydraulic distribution circuit 46 (FIG. 14) by means of an intermediate circuit 35 of the back plate 32, so as to transfer the hot heat-carrying fluid, exiting from the individual hydraulic circuits 13 through the hydraulic outlet connectors 23, 35 toward a heat exchanger 50 disposed, for example, outside the premises in which the processing unit 40 operates.

The heat-carrying fluid, progressively cooled, is made to re-enter the individual entrances of the hydraulic circuits 13, that is, through the inlet hydraulic connectors 22, 36 in order to remove the heat absorbed by the extraction surface 24.

Therefore, the device 10 according to the present invention, as well as making the disposal and the transfer of heat from the associated electronic card 16 very efficient, allows a rapid extraction of the card 16 from the rack 30, when the latter is hot, that is, without switching off the processing unit 40 and without interrupting the flow of the heat-carrying fluid in the intermediate circuit 35, in the distribution circuit 46 and in the other hydraulic circuits 13 associated with the other cards 16. This allows to facilitate the maintenance operations and to reduce the relative times and costs thereof.

Moreover, with the device 10 according to the invention it is possible to avoid using moving mechanical components, such as cooling fans, mounted for example on the microprocessors 18 of the individual cards 16. In this way, as well as reducing the acoustic functioning noise of the cooling mechanical components, it is possible to increase the operating longevity of the cards 16, considerably reducing the probability of their breaking.

In addition the heat-carrying fluid circulating in the hydraulic circuits 13 can be brought to temperatures much lower than those of the premises in which the processing unit 40 is operating, maintaining the electronic cards 16 and the relative electronic components present thereon at a desired temperature. This allows to condition the functioning temperature of the electronic components, such as microprocessors, memory banks or other integrated circuits which define the hot spots of the cards, in an optimal functioning temperature range, thus reducing considerably the relative electric consumption.

A further advantage of the cooling device 10 with liquid according to the present invention is that, given its great efficiency in extracting heat from the electronic cards 16, due to the close reciprocal contact between the extraction surface 24 and the electronic components, it is also possible to use a relatively hot heat-carrying fluid, such as for example a heat-carrying fluid which is immersed in the hydraulic circuit 13 at a temperature of about 50° C. This allows to condition the components at a lower working temperature than their normal working temperature, more than about 70-80° C., in the absence of heat conditioning. This, in its turn, allows to use a heat exchanger 50 of the non-cooling type positioned outside the building for example. The heat exchanger can be of the dry type, or "dry-cooler", allowing to reduce even by 80% the cost of the heat exchanger and by 90% the relative functioning costs compared with using a cooling exchanger or "chiller".

On the contrary, if it is necessary to reduce the electric consumption of the electronic cards, and therefore the overall consumption of the processing unit, it is possible to use a heat-carrying fluid at a very low temperature, for example less than 0° C., adding a possible anti-freeze fluid to the heat-carrying fluid.

In this case, however, it is fundamental to avoid reaching dew temperature inside the processing unit 40, by providing a system to control the temperature and humidity of the environment. For example, if the temperature of the premises where the processing unit is positioned is about 25° C., then the temperature of the heat-carrying fluid circulating in the circuits 13 cannot be less than 17° C. if the humidity content of the air is less than about 60%. By reducing the humidity content of the air to about 45% it is possible to reduce, given the same ambient temperature, the temperature of the heat-carrying fluid to about 12° C. By further reducing the humidity content to about 20% it is possible to reduce, given the same ambient temperature, the temperature of the heat-carrying fluid to about 0° C.

It is clear that modifications and/or additions of parts may be made to the cooling device 10 with liquid for electronic cards, in particular for high-performance processing units, as described heretofore, without departing from the field and scope of the present invention.

The invention claimed is:

1. A cooling device for a plurality of electronic cards of a processing units, comprising at least a hydraulic circuit in which a heat-carrying fluid flows in order to extract heat produced by electronic components and/or by hot spots present on a printed circuit board of at least one electronic card that is associated with the cooling device, the cooling device comprising a cooling plate made of heat conductive material, and provided with a mechanical coupling means to said electronic card so as to be inserted together as a combined plate/card in a containing rack for the plurality of electronic cards of said processing unit, wherein said cooling plate has at least a heat extraction surface directly facing toward the printed circuit board on which said electronic components and/or said hot spots are present and at least partly in contact with, or at least in close reciprocal contact to said electronic components and/or said hot spots, said heat extraction surface having protruding dissipation portions, configured to be disposed at the position of the electronic components and/or the hot spots of said electronic card wherein said heat extraction surface is able to contact said electronic components and/or hotspots, said hydraulic circuit being made in a thickness of said cooling plate and comprising a plurality of hydraulic sub-circuits in a grid structure which are selectively activated by a switching/deflector means including plugs disposed along at least part of said hydraulic sub-circuits in order to define desired paths which can be selectively varied by switching a flow of the heat-carrying fluid in correspondence with the electronic components and/or with the hot spots of said electronic card, and wherein said cooling plate has a sliding guide means able to cooperate with a corresponding alignment means of the containing rack in order to insert/extract the combined plate/card into/from the containing rack.

2. The cooling device as in claim 1, wherein said sliding guide means comprise grooves or guides, which develop longitudinally on one or more lateral edges of the cooling plate.

3. The cooling device as in claim 1, wherein the cooling plate has holed portions made in specific positions corresponding to predetermined zones of the at least one electronic card that is associated with the cooling device, wherein there is no production of heat at the predetermined zones.

4. The cooling device as in claim 1, wherein the cooling plate has an attachment means to the electronic card which are positioned in correspondence with a mating clamping means of a backplate associated with a micro-processor mounted on the electronic card, wherein said backplate is mounted on an opposite face of the electronic card to that on which the micro-processor is mounted.

5. The cooling device as in claim 1, wherein at least part of said protruding portions are associated with a heat interface layer to promote transfer of heat from the electronic components and/or from the hot spots toward the cooling plate.

6. The cooling device as in claim 1, wherein the heat extraction surface comprises hollow portions configured to be disposed at a position of specific electronic components on said electronic card and with a depth coordinated to a height of said specific electronic components.

7. The cooling device as in claim 1, wherein the cooling plate comprises rapid disconnection and dripless hydraulic connectors, which are associated with an entrance and an exit of the hydraulic circuit.

8. The cooling device as in claim 1, wherein the cooling plate is mechanically coupled to the electronic card by the attachment means and an elastic traction means.

9. The cooling device as in claim 1, wherein the cooling plate has an auxiliary heat extraction surface, opposite said heat extraction surface, for association with a different electronic card than the at least one electronic card that is associated with the cooling device.

10. The cooling device as in claim 1, wherein the cooling plate comprises extraction handles in order to facilitate handling of the at least one electronic card that is associated with the cooling device.

11. An electronic card of a processing unit of a super computer, wherein the electronic card is provided with a cooling device with the heat-carrying fluid as in claim 1.

* * * * *